United States Patent
Krämer et al.

(10) Patent No.: US 8,255,024 B2
(45) Date of Patent: Aug. 28, 2012

(54) RESISTIVE SUPERCONDUCTING CURRENT-LIMITER DEVICE WITH BIFILAR COIL WINDING COMPOSED OF HTS RIBBON CONDUCTORS AND TURN SEPARATOR

(75) Inventors: Hans-Peter Krämer, Erlangen (DE); Wolfgang Schmidt, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 790 days.

(21) Appl. No.: 12/309,315

(22) PCT Filed: Jun. 21, 2007

(86) PCT No.: PCT/EP2007/056204
§ 371 (c)(1),
(2), (4) Date: Jan. 14, 2009

(87) PCT Pub. No.: WO2008/006689
PCT Pub. Date: Jan. 17, 2008

(65) Prior Publication Data
US 2009/0286685 A1    Nov. 19, 2009

(30) Foreign Application Priority Data
Jul. 14, 2006   (DE) .................. 10 2006 032 702

(51) Int. Cl.
*H01L 39/16*   (2006.01)
*H02H 9/02*    (2006.01)
*H01L 39/02*   (2006.01)

(52) U.S. Cl. ............ 505/210; 505/850; 361/19; 338/13; 338/32 S; 336/207; 336/208

(58) Field of Classification Search .............. 505/210, 505/211, 230, 236–238, 430, 433, 704, 705; 335/216; 336/206–207; 361/19; 338/13, 338/32 S; 174/125.1; 428/930
See application file for complete search history.

(56) References Cited

U.S. PATENT DOCUMENTS

| | | | |
|---|---|---|---|
| 5,318,948 A * | 6/1994 | Okada et al. | 505/230 |
| 6,522,236 B1 * | 2/2003 | Ries | 338/13 |
| 6,552,415 B1 | 4/2003 | Paul et al. | |
| 2002/0018327 A1 * | 2/2002 | Walker et al. | 361/58 |
| 2008/0070788 A1 | 3/2008 | Kramer et al. | |

FOREIGN PATENT DOCUMENTS

| | | |
|---|---|---|
| DE | 198 36 860 A1 | 2/2000 |
| DE | 10 2004 048 646 A1 | 4/2006 |
| EP | 0 444 702 A2 | 9/1991 |
| EP | 0 503 448 A2 | 9/1992 |

(Continued)

OTHER PUBLICATIONS

A. Goyal et al.; "Epitaxial Superconductors on Rolling-Assisted Biaxially-Textured Substrates (RABiTS): A Route Towards High Critical Current Density Wire"; Applied Superconductivity vol. 4. Nos. 10-11, 1996, pp. 403-427.

*Primary Examiner* — Stanley Silverman
*Assistant Examiner* — Kallambella Vijayakumar
(74) *Attorney, Agent, or Firm* — Staas & Halsey LLP

(57) ABSTRACT

Between adjacent windings of a bifilar coil made of an HTS strip conductor in a resistive superconductive current limiter device, a spacer is provided which is transparent for a coolant. The spacer includes an electrically insulating support tape for sufficiently massive spacer elements attached thereon. The spacer elements are spaced and made of a material having high thermal conductivity. The spaces between the spacer elements form cooling channels for the coolant.

13 Claims, 2 Drawing Sheets

FOREIGN PATENT DOCUMENTS

| WO | 99/33122 | 7/1999 |
| WO | 2004/006345 A2 | 1/2004 |
| WO | WO 2004/006345 | * 1/2004 |
| WO | 2006/037741 A1 | 4/2006 |

* cited by examiner

RESISTIVE SUPERCONDUCTING CURRENT-LIMITER DEVICE WITH BIFILAR COIL WINDING COMPOSED OF HTS RIBBON CONDUCTORS AND TURN SEPARATOR

CROSS REFERENCE TO RELATED APPLICATIONS

This application is based on and hereby claims priority to German Application No. 10 2006 032 702.0 filed on Jul. 14, 2006, the contents of which are hereby incorporated by reference.

BACKGROUND

Described below is a superconducting current-limiter device of the resistive type having at least one bifilar coil winding composed of at least one HTS conductor in the form of a ribbon, with at least one electrically insulating spacer being arranged between adjacent turns of the coil winding, which spacer is transparent for a coolant, at least in subareas. A resistive current-limiter device such as this is disclosed in DE 10 2004 048 646 A1.

Since superconducting metal-oxide compounds have become known, with high critical temperatures $T_c$ of above 77 K, and which are therefore also referred to as high $T_c$ superconductor materials or HTS materials, and which in particular allow liquid-nitrogen (LN2) cooling, attempts have been made to also design superconducting current-limiter devices using corresponding HTS conductors. One such current-limiter device is disclosed in the abovementioned DE-A1 document. This is formed with at least one HTS conductor in the form of a ribbon, which has a metallic, textured support ribbon, in particular a so-called RABiTS ribbon composed of a nickel alloy (cf. "Applied Superconductivity", Vol. 4, Nos. 10-11, 1996, pages 403 to 427). A layer system composed of oxidic buffer materials, such as $CeO_2$ or $Y2O_3$, and the HTS material, in particular composed of $YBa_2Cu_3O_x$ (so-called "YBCO"), is deposited on this support ribbon. This structure is also coated with a thin normally conductive covering layer, in order to suppress so-called hotspots (cf. also DE 198 36 860 A1), in which measures are also taken in order to prevent electrical flashovers between the covering layer and the metallic substrate ribbon. A corresponding conductor type is also referred to as a coated conductor. In the case of the known current-limiter device, a spiral bifilar coil winding formed of an HTS ribbon conductor such as this is wound, with good accessibility for the coolant $LN_2$. For this purpose, a spacer in the form of a ribbon and composed of insulating material is also wound in with the HTS ribbon conductor, at the same time ensuring adequate mutual insulation between adjacent coil turns.

WO99/33122 discloses a superconducting current-limiter device of the resistive type which has a superconducting conductor track. The superconducting conductor track is in the form of a bifilar disk winding, with insulating ribbons being located between adjacent ribbon layers of the winding, for electrical insulation. Insulating ribbons such as these may, for example, have a corrugated or ribbed structure.

EP 0 444 792 A2 discloses a superconducting coil of a thin-film superconductor (coated conductor). The thin-film superconductor can be shaped to form a so-called pancake coil. In this case, adjacent turns can be separated from one another by web-like spacing elements which are effectively separated from one another in the extent direction of a support ribbon.

The amount of HTS ribbon conductor material required, and the specific costs, are critical factors for the financial viability of corresponding current-limiter devices. The amount of material is itself governed by the parameters "critical current per width of the ($I_c$/w)" and the "maximum permissible voltage drop per length of the ribbon (U/L)". Both parameters should be as high as possible. While the variable $I_c$/w is governed only by the characteristics and the production method of the superconductor layer, the variable U/L depends on the characteristics of the non-superconducting parts of the layer structure, that is to say in particular on the sub-strate ribbon final temperature of the current-limiter coil winding during a limiting phase $(U/L)^2$ is governed by the product of the sheet resistance and the area-related heat capacity added over all the layers of the conductor structure. For example, for an RABiTS ribbon conductor with a nickel-alloy substrate ribbon, whose thermal mass is formed essentially by the substrate ribbon, the variable U/L is equal to 0.4 V/cm for a switch-off time of 50 ms and a final temperature of 300 K. In another known type of current-limiter device, in which an HTS conductor track is formed on an extended substrate plate composed of sapphire and has a gold covering layer, U/L is in contrast in the range from 9 to 10 V/cm. The reason for this considerably higher value for a "sapphire plate conductor" such as this is that the substrate, which has a high available heat capacity, at the same time produces virtually no Joule heat as an insulator, however.

SUMMARY

An aspect is to design the current-limiter device with the features mentioned initially such that it has better heat dissipation and a higher maximum permissible voltage per conductor length than known current-limiter devices of the same type using HTS ribbon conductors (coated conductors).

The current-limiter device having the features mentioned initially should accordingly be designed such that its spacer has a support ribbon, which is in the form of a ribbon, is composed of electrically insulating material and is provided on at least one of its flat faces with spacing elements composed of electrically insulating material, which are separated from one another in the extent direction of the support ribbon and are composed of a material with high thermal conductivity. In this context, the expression a high thermal conductivity means a value λ of at least 10 W/m·K.

The advantages associated with this refinement of the current-limiter device are, in particular, that, in addition to an electrically insulating function, its spacer also acts as a so-called "heat sink". In this case, this heat sink can be designed such that, with normal insulating material specific heats, the variable U/L is considerably increased (that is to say by a factor of at least 2) over that of a "bare" ribbon conductor (without spacer). In particular, this can also be achieved by an adequate thickness (measured in the separation direction between the turns) of, in particular, more than 0.5 mm. The heat sink in this case advantageously does not restrict the production of corresponding coil windings composed of the HTS ribbon conductor, since it can be designed to be sufficiently flexible for this purpose. In addition, its thermal conductivity can be set to be sufficiently high that the Joule heat produced in the metallic components of the HTS ribbon conductor can penetrate sufficiently deeply during the limiting time of the current limiters, that is to say a high thermal diffusion constant is achieved, thus resulting in a high heat capacity per conductor unit area. Furthermore, the thermal contact resistance between the metallic HTS ribbon conductor and the electrically insulating heat sink can also be kept sufficiently low. Finally, the heat sink lengthens the cooling-down time after a limiting phase only to a minor extent. Because the cooling-down time is governed essentially by the ratio of the stored energy to the surface area available for heat dissipation, the boundary surface area available to the coolant for cooling down can be increased, analogously to the increased heat capacity, by the configuration of the spacer.

Advantageous refinements of the superconducting current-limiter device may have the following features:

- The spacing elements can thus advantageously be in the form of webs. Spacing elements such as these can be designed to be sufficiently solid for good heat dissipation, and their mutual separation can also be chosen for good coolant transparency. The required support ribbon flexibility is in this case virtually unrestricted.
- The spacing elements may be formed from a ceramic material. The requirement for high thermal conductivity is satisfied well in particular by $Al_2O_3$ or AlN.
- The spacing elements can be mounted on one side of the support ribbon or else on both sides, on its flat face or faces, such that, together with the support ribbon, they form a common component which can be prefabricated. This allows universal use of the spacer.
- The mounting of the spacing elements on the support ribbon can in this case advantageously be achieved by adhesive bonding.
- The support ribbon may be composed of a plastic material. Corresponding support ribbons are on the one hand sufficiently flexible, but on the other hand they ensure good electrical insulation between turns.
- In addition, the spacing elements can be mechanically connected to the part of the HTS conductor which in each case rests on them. An appropriate connection makes it possible to achieve a good thermal contact between these parts.
- For this purpose, the spacing elements can be adhesively bonded to the respective HTS conductor part, or else can be soldered after initial tinning of the corresponding areas.

BRIEF DESCRIPTION OF THE DRAWINGS

These and other aspects and advantages will become more apparent and more readily appreciated from the following description of the exemplary embodiments, taken in conjunction with the accompanying drawings of which.

DETAILED DESCRIPTION OF THE PREFERRED EMBODIMENT

Reference will now be made in detail to the preferred embodiments, examples of which are illustrated in the accompanying drawings, wherein like reference symbols refer to like elements throughout.

Figure 1:
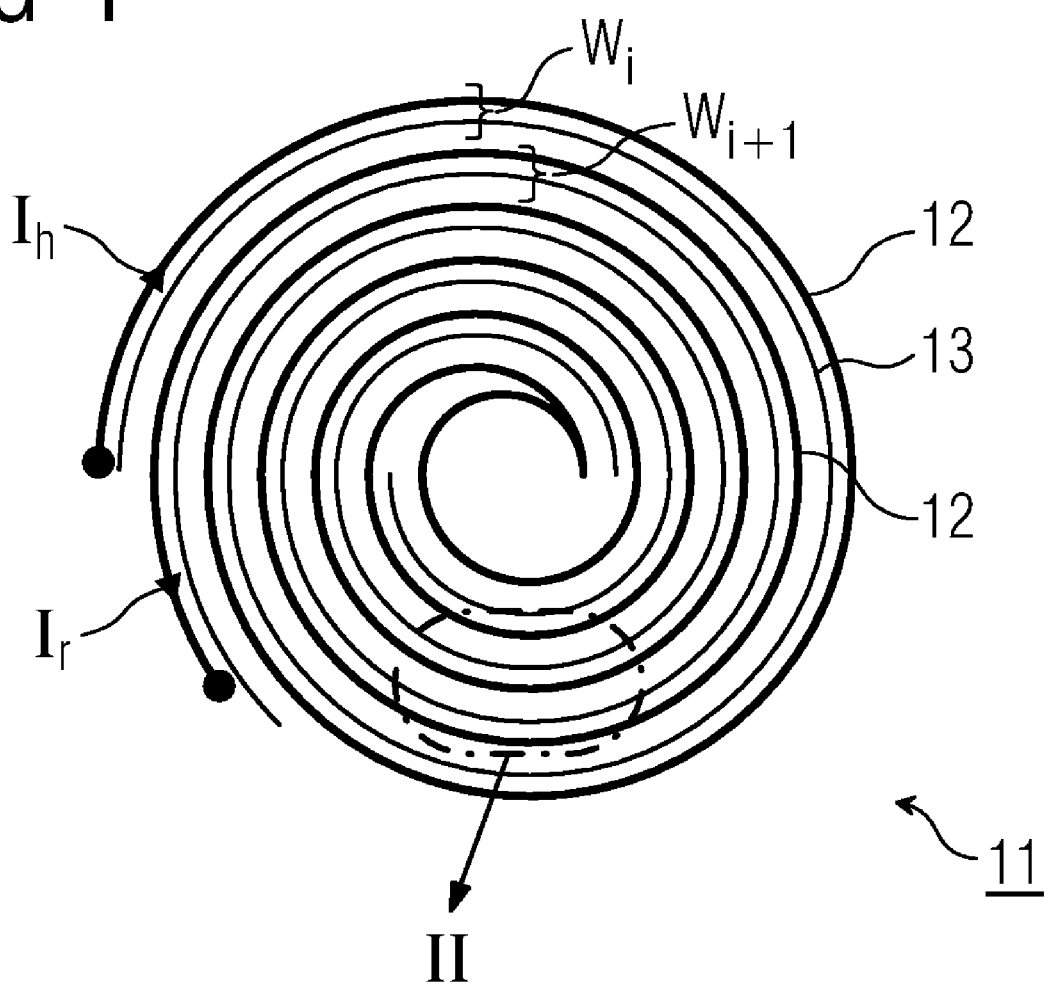
FIG. 1 is a plan view of the basic design of a bifilar coil winding of the current-limiter device.

FIG. 1 shows the major parts of a design of a coil winding, which is annotated 11 in general, of a current-limiter device. This design is based on embodiments, which are known per se, of bifilar coil windings of corresponding devices, for example as disclosed in the cited DE 10 2004 048 646 A1. The coil winding is created with at least one HTS conductor 12 in the form of a ribbon, in particular a YBCO ($YBa_2Cu_3O_x$) ribbon conductor of the coated-conductor type, as a flat winding in the form of a disk. Corresponding ribbon conductors have a YBCO layer with at least one intermediate buffer layer on a substrate which is composed in particular of metal, with the YBCO layer being covered by a normally conductive covering layer (cf. for example the cited DE A1 document). During the creation of the coil winding 11, a spacer 13, which is transparent for a coolant at least in subareas, is also wound in with the YBCO ribbon conductor 12, which spacer 13 is sufficiently flexible for this purpose and ensures that adjacent turns $W_i, W_{i+1}$ are separated, as well as ensuring the required coolant transparency. Since the spacer 13 is composed at least partially of insulating material, this also ensures the required electrical insulation between the turns. Furthermore, FIG. 1 also indicates the current-flow directions of a current I, which is to be switched or is to be limited, in the forward direction as $I_h$ and in the return direction as $I_r$, by arrows.

Figure 2:
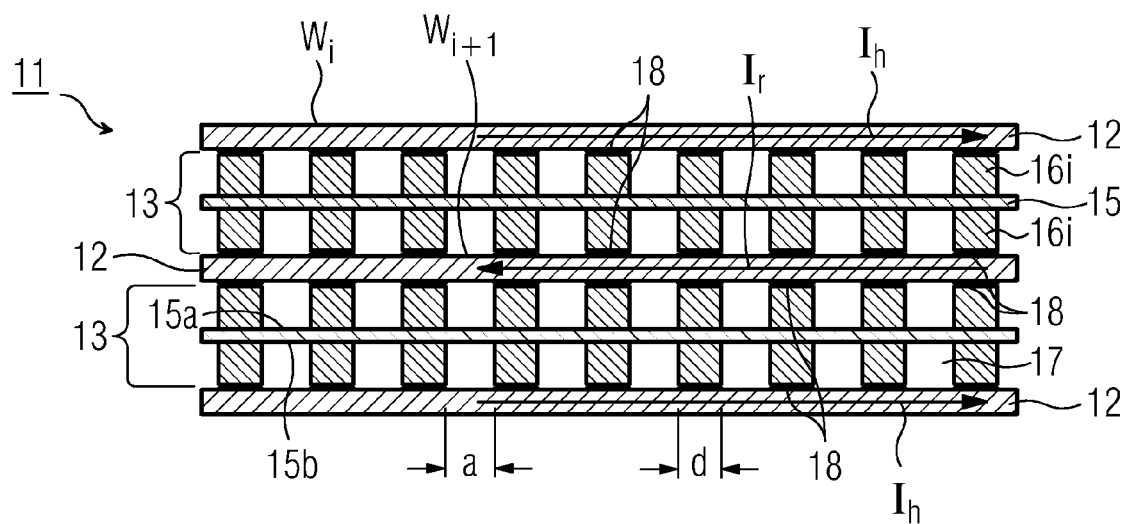
FIG. 2 is a cross sectional view of detail from the coil winding as shown in FIG. 1, illustrating a first embodiment option for the winding structure, in the form of a cross section.

One refinement of the spacer 13 is illustrated in FIG. 2, which shows a detail from the flat coil winding 11 shown in FIG. 1. The illustrated embodiment of the spacer 13 in this case has a flexible, electrically insulating support ribbon 15 composed, for example, of a commercially available insulating film, whose width is matched to that of the HTS ribbon conductor 12, and is approximately the same as it.

Furthermore, the electrically insulating support ribbon 15 may be broader than the HTS ribbon conductor 12 in order to comply with particular requirements for a higher withstand voltage.

Web-like spacing elements 16i are mounted one behind the other on the two flat faces 15a and 15b of this support ribbon 15 in the longitudinal direction, to be precise in the HTS conductor extent direction. For example, these spacing elements can be adhesively bonded onto the support ribbon 15. Together with the support ribbon 15, they advantageously form a component which can be prefabricated and is sufficiently flexible for winding construction. The spacing elements 16i, which extend transversely with respect to the longitudinal direction, have a predetermined thickness d and a predetermined mutual separation a. Their width corresponds at least approximately to that of the support ribbon 15 and/or to that of the HTS ribbon conductor 12 in the respectively adjacent coil turn. The width of the support ribbon 15 can likewise advantageously be greater than the width of the HTS ribbon conductor 12, and in particular the width of the support ribbon 15 can assume essentially twice the value of the width of the HTS ribbon conductor 12.

The thickness d and the separation a are advantageously chosen such that the spacing elements 16i can represent a heat sink which is sufficiently passive for a switching function and hot-spot suppression. If a ceramic of high thermal conductivity (for example $Al_2O_3$ or AlN is chosen in particular for the spacing elements 16i, then d and a may at least approximately be in the same order of magnitude of, for example, 1 mm to 5 mm. This means that the spacing elements 16i can be separated by a distance a of between 1 mm and 5 mm in the longitudinal direction of the ribbon conductor. Their thickness d measured in this direction may in this case be between 1 mm and 5 mm. The thermal conductivity λ of the ceramics is in this case in a range from about 10 W/mK to 60 W/mK (at 20° C.), and, for example, is 45 W/mK for $Al_2O_3$.

The spacer 13, which can thus be regarded as a "web ribbon", can be wound, because it is sufficiently flexible, together with the HTS ribbon conductor 12 in a known manner to form the bifilar flat-coil winding 11. In this case, at least the support ribbon 15 at the same time also provides electrical insulation between the individual turns $W_i, W_{i+1}$ of the coil winding. The remaining intermediate spaces, which form cooling channels 17, between the web-like spacing elements 16i allow good transparency for a coolant such as $LN_2$. In this case, it is advantageous that the spacer 13, which acts as a heat sink, and the HTS ribbon conductor 12 are initially separated from one another, that is to say they can also be prefabricated in separate process steps, and/or can be obtained from different manufacturers. The manufacturer of the HTS ribbon conductor 12 can thus keep his standard process, unchanged.

Other embodiments can, of course, also be used for the spacing elements 16i provided that they make it possible to provide a sufficiently large "thermal mass" and high thermal conductivity of a heat sink, thus allowing the stated functions to be achieved. For example, different sizes may be provided for the distance a and/or the thickness d, as well as different shapes for the spacing elements.

It is particularly advantageous to ensure good thermal contact between the HTS ribbon conductor 12 and the spacer 13 with its spacing elements 16i. In order to produce a corresponding "solid-body contact" between these parts, it is possible, for example, to impregnate the flat-coil winding with a low-viscosity impregnation resin after the winding process, which resin also penetrates into the narrow gaps between the HTS ribbon conductor 12 and the adjacent spacing elements 16i, but flows out of the area between the spacing elements 16i again, thus once again opening or leaving open the desired cooling channels 17 between the spacing elements 16i.

Other techniques can, of course, also be used to make an appropriate thermal contact between the spacing elements 16i and the HTS ribbon conductor 12. For example, those faces of the spacing elements 16i, which are ceramic by way of example, which touch the HTS ribbon conductor 12 can be metallized and provided with a solder layer. The finished coil winding is then heated to the melting temperature of the solder such that it forms a joint with the metallic, possibly likewise pretinned surface of the HTS ribbon conductor 12 or its normally conductive covering layer. In the figures, corresponding solder points (or adhesion points according to the alternative connection technique) between the spacing elements 16i and the HTS ribbon conductor are only indicated, and annotated 18.

The design described above allows an adequate radial extent or thickness with respect to the coil winding for the spacing elements 16i, and therefore for the entire spacer 13. This extent or thickness can advantageously be greater than the thermal diffusion depth. By way of example in the case of web-like $Al_2O_3$ spacing elements 16i at a temperature of 300 K and with a normal switching time value of 50 ms, this thermal diffusion depth is about 0.8 mm. At the same time, this makes it possible to ensure a large cooling-down surface area by those side surfaces of the spacing elements 16i which face the cooling channels 17.

FIG. 2 also illustrates the parallel but opposite current-flow directions $I_h$ and $I_r$ in adjacent coil turns $W_i, W_{i+1}$ resulting from the bifilar design of the coil winding, by arrows on the HTS ribbon conductor 12.

Figure 3:
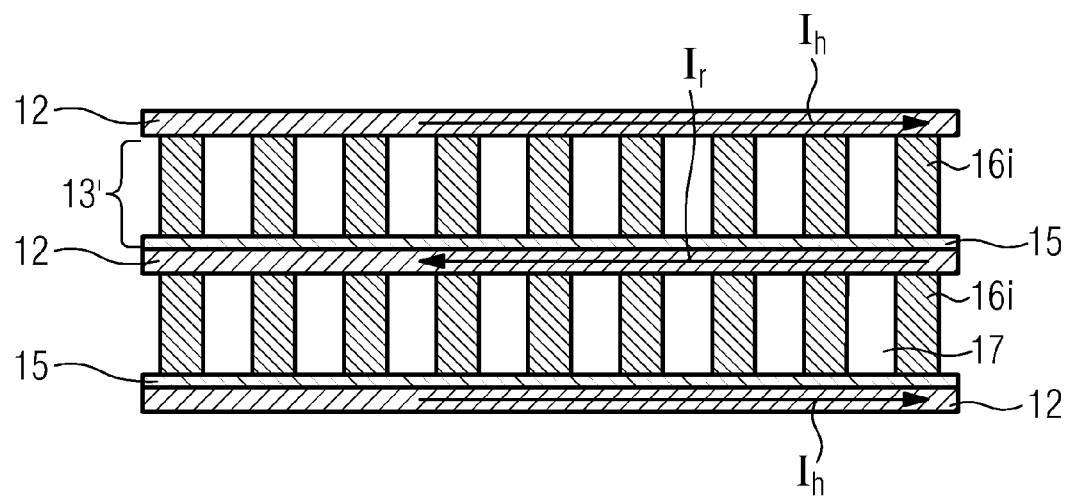
FIG. 3 is a cross sectional view of a further embodiment option of the winding structure, illustrated in a manner corresponding to FIG. 2.

The embodiment of spacers 13 illustrated in FIG. 2 has been based on the assumption that its spacing elements 16i are fitted on both sides of a support ribbon 15. In contrast to this, FIG. 3 shows an embodiment of a spacer 13' with the spacing elements 16i arranged on one side of a support ribbon 15.

The system also includes permanent or removable storage, such as magnetic and optical discs, RAM, ROM, etc. on which the process and data structures of the present invention can be stored and distributed. The processes can also be distributed via, for example, downloading over a network such as the Internet. The system can output the results to a display device, printer, readily accessible memory or another computer on a network.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A current-limiter device of a resistive type, comprising:
   at least one bifilar coil winding composed of
   at least one HTS conductor formed as a ribbon, and
   at least one electrically insulating spacer, arranged between adjacent turns of the at least one bifilar coil winding, transparent for a coolant, at least in subareas, having a support ribbon composed of electrically insulating material and provided on at least one flat face with spacing elements, mounted on and separated from one another along the support ribbon, composed of an electrically insulating material with a thermal conductivity at 20° C. of between 10 and 200 W/mK.

2. The current-limiter device as claimed in claim 1, wherein the spacing elements are formed as webs.

3. The current-limiter device as claimed in claim 1, wherein the spacing elements are formed from a ceramic material.

4. The current-limiter device as claimed in claim 3, wherein the ceramic material is $Al_2O_3$ or AlN.

5. The current-limiter device as claimed in claim 1, wherein the spacing elements are adhesively bonded to the support ribbon.

6. The current-limiter device as claimed in 1, wherein the support ribbon is composed of a plastic material.

7. The current-limiter device as claimed in claim 1, wherein the spacing elements and the support ribbon form a common, prefabricated component.

8. The current-limiter device as claimed in claim 1, wherein the spacing elements are separated in a longitudinal direction of the support ribbon by a distance between 1 mm and 5 mm.

9. The current-limiter device as claimed in claim 8, wherein the spacing elements have a thickness in the longitudinal direction of between 1 mm and 5 mm.

10. The current-limiter device as claimed in claim 9, wherein at least one of the support ribbon and the spacing elements have a width which corresponds at least approximately to that of the HTS ribbon conductor.

11. The current-limiter device as claimed in claim 9, wherein at least one of the support ribbon and the spacing elements have a width which corresponds at least approximately to twice that of the ribbon conductor.

12. The current-limiter device as claimed in claim 1, wherein each of the spacing elements are mechanically connected to a respective part of the at least one HTS ribbon conductor which rests thereon.

13. The current-limiter device as claimed in claim 12, wherein each of the spacing elements are one of adhesively bonded and soldered to the respective part of the HTS ribbon conductor.

* * * * *